United States Patent
Malik et al.

(10) Patent No.: US 6,564,356 B1
(45) Date of Patent: May 13, 2003

(54) METHOD AND APPARATUS TO ANALYZE SIMULATION AND TEST COVERAGE

(75) Inventors: Nadeem Malik, Austin, TX (US); Steven Leonard Roberts, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 195 days.

(21) Appl. No.: 09/704,598

(22) Filed: Nov. 2, 2000

(51) Int. Cl.[7] .............................................. G06F 17/50
(52) U.S. Cl. ................................................. 716/4; 716/5
(58) Field of Search ...................... 716/4, 5; 703/13–17; 714/739, 738, 25, 39, 33, 42

(56) References Cited

U.S. PATENT DOCUMENTS

| | | | | |
|---|---|---|---|---|
| 5,561,762 A | * | 10/1996 | Smith et al. ........... 395/183.09 |
| 5,604,895 A | * | 2/1997 | Raimi .......................... 395/500 |
| 6,076,173 A | * | 6/2000 | Kim et al. ....................... 714/25 |
| 6,182,258 B1 | * | 1/2001 | Hollander .................... 714/739 |
| 6,347,388 B1 | * | 2/2002 | Hollander .................... 714/739 |

* cited by examiner

Primary Examiner—Vuthe Siek
(74) Attorney, Agent, or Firm—Duke W. Yee; Mark E. McBurney; Stephen R. Tkacs

(57) ABSTRACT

A coverage analysis process and apparatus assigns a unique label for every unique cycle of data produced by simulation or testing. The labels are substituted for the signal evaluations producing a graph of labels over time. The coverage analysis then generates a function, which represents the graph and the function is stored. The functions are analyzed and compared to determine coverage information. The coverage analysis process and apparatus provides significant data compression and represents the coverage in a form, which can easily be analyzed and compared.

23 Claims, 2 Drawing Sheets

METHOD AND APPARATUS TO ANALYZE SIMULATION AND TEST COVERAGE

BACKGROUND OF THE INVENTION

1. Technical Field

The present invention relates to simulation and test of circuits and, in particular, to analysis of simulation and test coverage. More particularly, the present invention provides simulation and test coverage information using digital signal processing transforms.

2. Description of Related Art

Today's very large scale integration (VLSI) designs grow with exponential as the time to market continually constrains the time available to develop and test products. The most common design validation technique is simulation, where input vectors are applied to the design and the design is then checked for the desired functionality at its outputs. With combination circuits, it is easy to see that an exhaustive set of input stimulus consists of every possible combination of input signals.

When memory elements, such as latches and Arrays, are added to these designs, the logic is referred to as "sequential logic." The outputs of these circuits are a function of the inputs and the values in the memory elements. Therefore, one must consider every possible combination of input vectors and memory states to ensure an exhaustive set of input stimulus. An "input vector" is generally defined as an ordered grouping of all the input signals. However, an input vector may comprise a subset of the input signals. With designs having gates in the number of millions, it becomes impossible to exhaustively verify a design within a competitive time frame.

As a result, input vectors are typically chosen that excite particular behaviors. This technique is referred to as "event coverage." For example, if the design is a graphics accelerator, inputs that draw shapes may be chosen. Thus, the problem becomes one of determining input vectors, which ensure that properties of the design are maintained without explicitly understanding which input vectors exhibit these properties. In the example of a graphics accelerator, if a vertex queue has a fixed length, a property of the design may be that no combination of shapes would be drawn that results in an overflow of this queue. Since the input vector sequences that demonstrate this property are not evident, several thousand input vectors may be applied. Because some of the inputs would be logical "don't cares" for this particular property, it is often the case in testing a property that many redundant vectors are applied to the design making the process inefficient.

The increasing number of output states and the increasing number of input vectors needed to produce desired output states results in a cumbersome amount of data to store and analyze. The prior art provides compression for storage of the output states and comparison of the compressed data. However, the amount of data, even with compression, is still unwieldy and difficult to analyze.

Therefore, it would be advantageous to have improved method and apparatus for analyzing the coverage of simulation and test input vectors.

SUMMARY OF THE INVENTION

The present invention assigns a unique label for every unique cycle of data produced by simulation or testing. The labels are substituted for the signal evaluations producing a graph of labels over time. The present invention then generates a function, which represents the graph and the function is stored. Since the function is stored using a small amount of text, as opposed to thousands or millions of states, the labeling and function generation of the present invention results in a form of data compression. Furthermore, the present invention compares the functions to determine coverage information. For example, if two functions overlap, the coverage information may indicate that inputs are producing redundant results.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
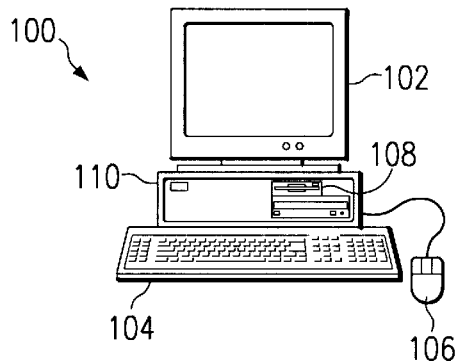
FIG. 1 is a pictorial representation of a data processing system in which the present invention may be implemented in accordance with a preferred embodiment of the present invention.

With reference now to the figures and in particular with reference to FIG. 1, a pictorial representation of a data processing system in which the present invention may be implemented is depicted in accordance with a preferred embodiment of the present invention. A computer 100 is depicted which includes a system unit 110, a video display terminal 102, a keyboard 104, storage devices 108, which may include floppy drives and other types of permanent and removable storage media, and mouse 106. Additional input devices may be included with personal computer 100, such as, for example, a joystick, touchpad, touch screen, trackball, microphone, and the like. Computer 100 can be implemented using any suitable computer, such as an IBM RS/6000 computer or IntelliStation computer, which are products of International Business Machines Corporation, located in Armonk, N.Y. Although the depicted representation shows a computer, other embodiments of the present invention may be implemented in other types of data processing systems, such as a network computer. Computer 100 also preferably includes a graphical user interface that may be implemented by means of systems software residing in computer readable media in operation within computer 100.

Figure 2:
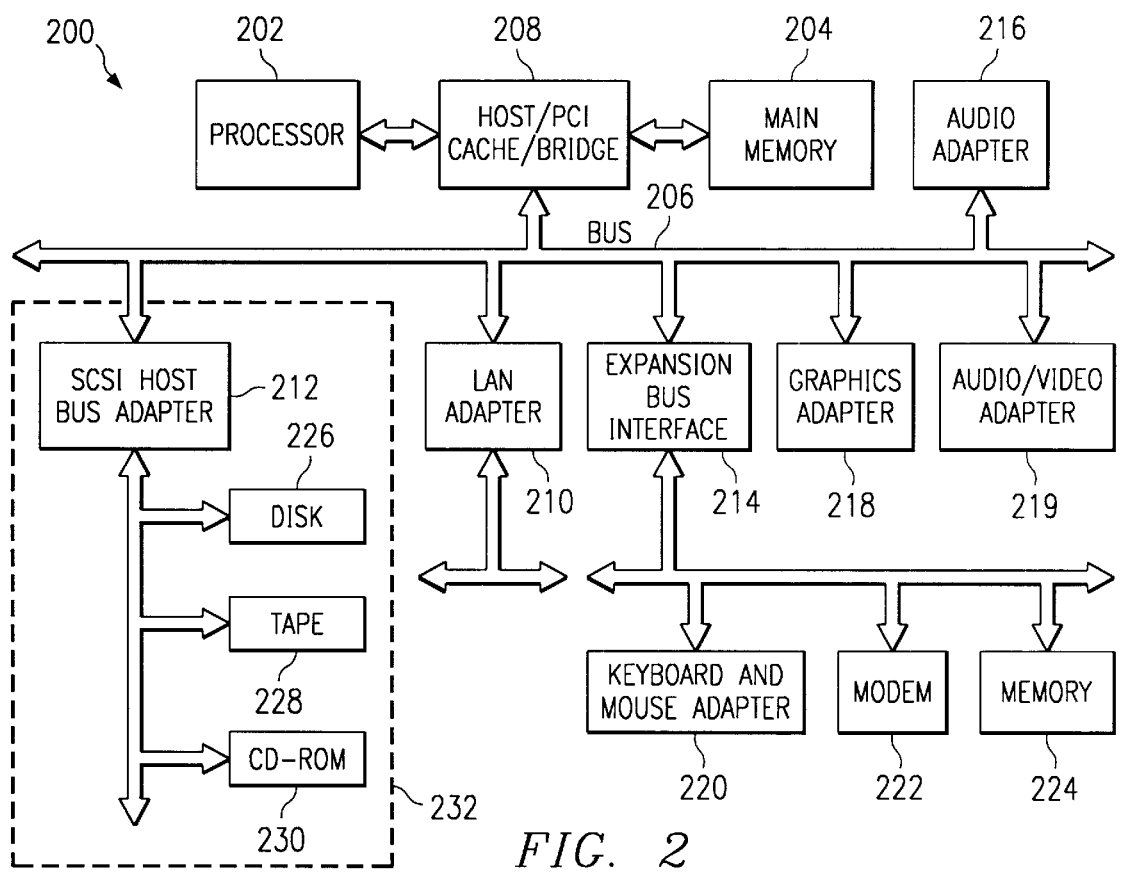
FIG. 2 is a block diagram of a data processing system in which the present invention may be implemented.

With reference now to FIG. 2, a block diagram of a data processing system is shown in which the present invention may be implemented. Data processing system 200 is an example of a computer, such as computer 100 in FIG. 1, in which code or instructions implementing the processes of the present invention may be located. Data processing system 200 employs a peripheral component interconnect (PCI) local bus architecture. Although the depicted example employs a PCI bus, other bus architectures such as Accelerated Graphics Port (AGP) and Industry Standard Architecture (ISA) may be used. Processor 202 and main memory 204 are connected to PCI local bus 206 through PCI bridge 208. PCI bridge 208 also may include an integrated memory controller and cache memory for processor 202. Additional connections to PCI local bus 206 may be made through direct component interconnection or through add-in boards. In the depicted example, local area network (LAN) adapter 210, small computer system interface SCSI host bus adapter 212, and expansion bus interface 214 are connected to PCI local bus 206 by direct component connection. In contrast, audio adapter 216, graphics adapter 218, and audio/video adapter 219 are connected to PCI local bus 206 by add-in boards inserted into expansion slots. Expansion bus interface 214 provides a connection for a keyboard and mouse adapter 220, modem 222, and additional memory 224. SCSI host bus adapter 212 provides a connection for hard disk drive 226, tape drive 228, and CD-ROM drive 230. Typical PCI local bus implementations will support three or four PCI expansion slots or add-in connectors.

An operating system runs on processor 202 and is used to coordinate and provide control of various components within data processing system 200 in FIG. 2. The operating system may be a commercially available operating system such as Windows 2000, which is available from Microsoft Corporation. An object oriented programming system such as Java may run in conjunction with the operating system and provides calls to the operating system from Java programs or applications executing on data processing system 200. "Java" is a trademark of Sun Microsystems, Inc. Instructions for the operating system, the object-oriented programming system, and applications or programs are located on storage devices, such as hard disk drive 226, and may be loaded into main memory 204 for execution by processor 202.

Those of ordinary skill in the art will appreciate that the hardware in FIG. 2 may vary depending on the implementation. Other internal hardware or peripheral devices, such as flash ROM (or equivalent nonvolatile memory) or optical disk drives and the like, may be used in addition to or in place of the hardware depicted in FIG. 2. Also, the processes of the present invention may be applied to a multiprocessor data processing system.

For example, data processing system 200, if optionally configured as a network computer, may not include SCSI host bus adapter 212, hard disk drive 226, tape drive 228, and CD-ROM 230, as noted by dotted line 232 in FIG. 2, denoting optional inclusion. In that case, the computer, to be properly called a client computer, must include some type of network communication interface, such as LAN adapter 210, modem 222, or the like. As another example, data processing system 200 may be a stand-alone system configured to be bootable without relying on some type of network communication interface, whether or not data processing system 200 comprises some type of network communication interface. As a further example, data processing system 200 may be a personal digital assistant (PDA), which is configured with ROM and/or flash ROM to provide non-volatile memory for storing operating system files and/or user-generated data.

The depicted example in FIG. 2 and above-described examples are not meant to imply architectural limitations. For example, data processing system 200 also may be a notebook computer or hand held computer in addition to taking the form of a PDA. Data processing system 200 also may be a kiosk or a Web appliance.

The processes of the present invention are performed by processor 202 using computer implemented instructions, which may be located in a memory such as, for example, main memory 204, memory 224, or in one or more peripheral devices 226–230.

The result of an individual simulation is a set of signal evaluations over a given duration of time as the input sequence changes. The present invention assigns a unique label for every unique cycle or state of data produced. A state is a function of all the registers in the chip and inputs into the chip. Thus, rather than storing thousands of bits for an output signal, the signal may be replaced with a simple label, such as "A." Then the labels are substituted for the signal evaluations producing a graph of labels over time, in cycles.

Figure 3:
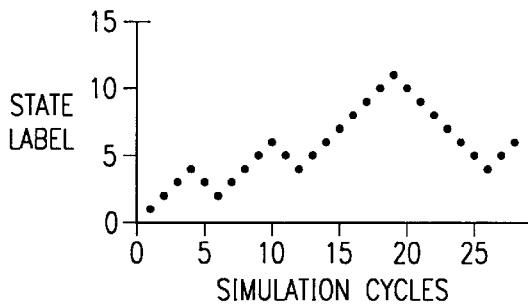
FIG. 3 is an exemplary graph of labels in accordance with a preferred embodiment of the present invention.

With reference now to FIG. 3, an exemplary graph of labels is shown in accordance with a preferred embodiment of the present invention. According to the example in FIG. 3, a device under test or simulation may have two bits of input and two bits of output, thus producing sixteen possible signal evaluations. Each of these sixteen unique signal evaluations is assigned a label between zero and fifteen. However, the device under test may have millions of possible signal evaluations.

According to a preferred embodiment of the present invention, each new state is assigned a monotonically increasing number. Thus, if a sequence of input vectors constantly produces new output states, the resulting graph has a constant upward slope. A downward slope or repeated label within the graph indicates a redundant state. While the number of possible input and output bit combinations may be in the millions, the number of labels assigned is limited to the number of new states encountered. Thus, in the example shown in FIG. 3, the device may have millions of possible states with only eleven such states having been encountered.

Figure 4:
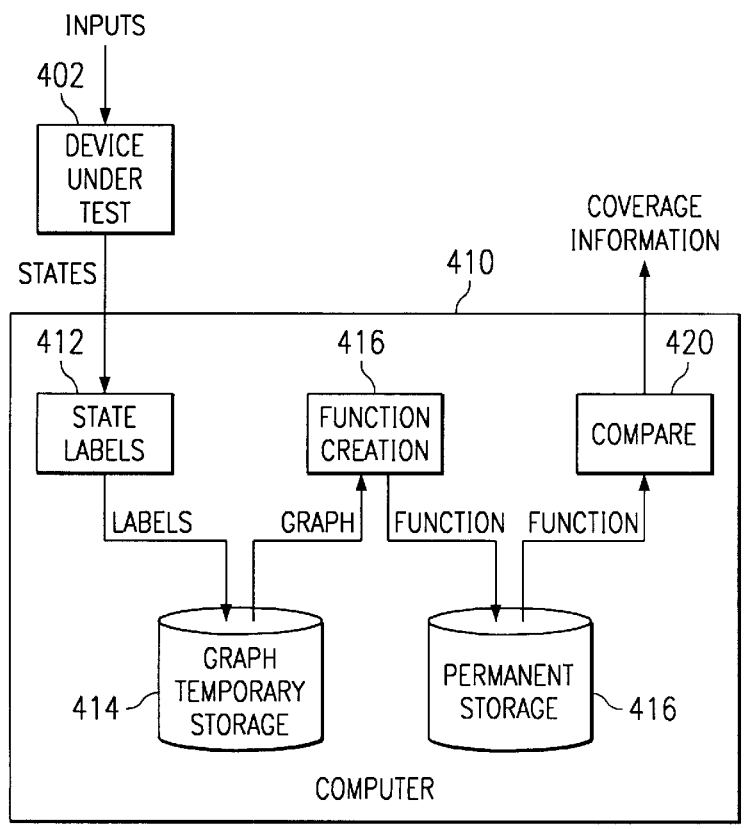
FIG. 4 is a block diagram of functional components in accordance with a preferred embodiment of the present invention.

Turning now to FIG. 4, a block diagram of functional components is depicted in accordance with a preferred embodiment of the present invention. A device under test 402 receives input vectors, which result in states being provided to computer 410. The device under test may be a VLSI component or other electronic product being tested. The device under test may also be a simulation of a device. The simulation may comprise software and/or hardware residing within computer 410 or outside the computer.

State labels module 412 receives the states and assigns a unique label to each unique state. The labels are stored in graph temporary storage 414 as a graph of labels versus time, in cycles. Labels may be assigned simply by merely establishing a one-to-one correspondence between each state and a label. Labels may also be assigned as monotonically increasing as new states are encountered, as discussed above. However, other labeling schemes may be used to improve performance. For example, like states may be coded close together over integers or the states may be encoded such that localized state machines are close together. The former scheme allows for fuzzy correlation between states considered to be more or less the same as specified by the designers, while the latter allows for coverage decomposition in the case where coverage analysis is examined at a unit level in lieu of a system level.

Function creation module 416 retrieves a graph from graph temporary storage 414 and derives a function from the graph. The function may be derived using known techniques. The function then is stored as text in permanent storage 416. For example, if the graph is a continuous upward slope, the function may be "label=cycle" or "y=x."

Thus, only the text "y=x" is stored in the permanent storage, resulting in a significant compression of data. Function creation module 416 may also perform a discrete Fourier transform (DFT) or transform the function into the lossy domain with a wavelet approach, as known in the art, to further compress functions, which are complicated in the time domain. Furthermore, comparison of functions may be easier to perform in the frequency or lossy domains.

Compare module 420 retrieves functions from permanent storage 416 and compares the functions to derive coverage information. The comparison may be in the time domain, frequency domain, or lossy domain, depending on the functions. The comparison function is a simple equivilence check in the exact use or in the case of fuzzy coverage analysis may be a correlation function with an accuracy threshold. The coverage information then can be used to determine subsequent input vectors to attempt to realize desired coverage or to avoid redundant coverage.

Input vectors may be generated randomly using a random number generator under the control of a set of predetermined parameters. The coverage information may include the number of new states seen for a set of parameters. The coverage information may also include the total number of states seen. Thus, the parameters may be adjusted in response to the coverage information. For example, if a set of parameters for the input vector generator results in a low number of new states, one may adjust the parameters.

Figure 5:
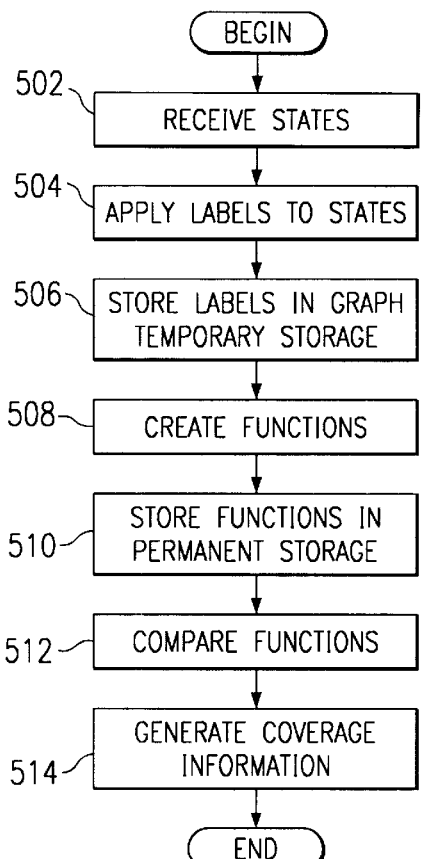
FIG. 5 is a flowchart illustrating the operation of coverage analysis in accordance with a preferred embodiment of the present invention.

With reference now to FIG. 5, a flowchart illustrating the operation of coverage analysis is shown in accordance with a preferred embodiment of the present invention. The process begins and receives the states from the device under test or simulation (step 502). Then, the process applies labels to the states (step 504) and stores the labels in the graph temporary storage (step 506) as a graph of labels versus simulation or test cycles. Next, the process creates functions that describe the graphs (step 508) and stores the functions in permanent storage (step 510). Thereafter, the process compares the functions (step 512), generates coverage information (step 514), and ends.

Thus, the present invention provides a method and apparatus for analyzing coverage of a device under test or simulation. The present invention acts on the states of a device, whose coverage space is much greater than what a human can input for event coverage. The present invention is also more convenient than the event approach, because it does not require prior knowledge of how the events correspond to output vectors. The present invention assigns labels only to encountered states and derives and stores functions based on the labels. Thus, the present invention provides significant data compression and represents the coverage in a form, which can easily be analyzed and compared. The coverage information then can be used to determine subsequent input vectors to attempt to realize desired coverage or to avoid redundant coverage.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media such a floppy disc, a hard disk drive, a RAM, and CD-ROMs and transmission-type media such as digital and analog communications links.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for providing coverage information for a set of input vectors, comprising:
   receiving a set of states, each state corresponding to an input vector of the set of input vectors during a cycle;
   assigning a label to each state in the set of states;
   identifying a first function that represents a graph of labels versus cycles; and
   generating coverage information based on the function.

2. The method of claim 1, further comprising:
   storing the graph of labels versus cycles in a storage.

3. The method of claim 1, further comprising:
   storing the function in a storage.

4. The method of claim 1, further comprising performing a transform on the first function to form a frequency domain function.

5. The method of claim 1, further comprising performing compression on the set of states.

6. The method of claim 5, wherein the compression is lossy compression.

7. The method of claim 5, wherein the compression is wavelet compression.

8. The method of claim 1, wherein the step of generating coverage information comprises comparing the first function to at least a second function.

9. The method of claim 8, wherein the step of generating coverage information further comprises determining whether the first function and the second function overlap.

10. The method of claim 1, further comprising:
    determining a second set of input vectors based on the coverage information.

11. The method of claim 1, further comprising:
    presenting the coverage information.

12. An apparatus for providing coverage information for a set of input vectors, comprising:
    receipt means for receiving a set of states, each state corresponding to an input vector of the set of input vectors during a cycle;
    assignment means for assigning a label to each state in the set of states;
    identification means for identifying a first function that represents a graph of labels versus cycles; and
    generation means for generating coverage information based on the function.

13. The apparatus of claim 12, further comprising:
    storage means for storing the graph of labels versus cycles.

14. The apparatus of claim 12, further comprising:
    storage means for storing the function.

15. The apparatus of claim 12, further comprising means for performing a transform on the first function to form a frequency domain function.

16. The apparatus of claim 12, further comprising means for performing compression on the set of states.

17. The apparatus of claim 16, wherein the compression is lossy compression.

18. The apparatus of claim 16, wherein the compression is wavelet compression.

19. The apparatus of claim 12, wherein the generation means comprises means for comparing the first function to at least a second function.

20. The apparatus of claim 19, wherein the generation means further comprises means for determining whether the first function and the second function overlap.

21. The apparatus of claim 12, further comprising:

determination means for determining a second set of input vectors based on the coverage information.

22. The apparatus of claim 12, further comprising:

presentation means for presenting the coverage information.

23. A computer program product, in a computer readable medium, for providing coverage information for a set of input vectors, comprising:

instructions for receiving a set of states, each state corresponding to an input vector of the set of input vectors during a cycle;

instructions for assigning a label to each state in the set of states;

instructions for identifying a first function that represents a graph of labels versus cycles; and instructions for generating coverage information based on the function.

* * * * *